US011095013B1

(12) United States Patent
Tsironis

(10) Patent No.: US 11,095,013 B1
(45) Date of Patent: Aug. 17, 2021

(54) INTEGRATED TERA-HERTZ SLIDE SCREW TUNER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 16/850,451

(22) Filed: Apr. 16, 2020

(51) Int. Cl.
   *H01P 5/04* (2006.01)
   *H02N 2/02* (2006.01)
   *H03H 7/40* (2006.01)

(52) U.S. Cl.
   CPC ............ *H01P 5/04* (2013.01); *H02N 2/026* (2013.01); *H03H 7/40* (2013.01)

(58) Field of Classification Search
   CPC ............ H03H 7/40; H01P 5/04; H02N 2/06
   See application file for complete search history.

(56) References Cited

U.S. PATENT DOCUMENTS

| | | | | |
|---|---|---|---|---|
| 10,637,122 B1* | 4/2020 | Tsironis | ............ | H04L 25/0228 |
| 10,693,437 B1* | 6/2020 | Tsironis | ............ | G01R 31/2822 |
| 10,700,402 B1* | 6/2020 | Tsironis | ............ | G01R 31/2625 |
| 2003/0184404 A1* | 10/2003 | Andrews | ............ | H01P 5/103 |
| | | | | 333/26 |

OTHER PUBLICATIONS

Load Pull [online], Wikipedia [retrieved on Nov. 18, 2016], Retrieved from Internet <URL:https://en.wikipedia.org/wiki/Load_pull>.
"V-band programmable tuner, model 7550", Product Note 5, Focus Microwaves Aug. 1993.
Standing wave ratio, VSWR [online], Wikipedia [retrieved Mar. 2, 2017], Retrieved from Internet <URL:http://en.wikipedia.org wiki/Standing _wave_ratio>.
"T-Wave Probes", Probe Selection Guide [online] FormFactor brochure 2018, p. 15 and 17 [retrieved on Apr. 14, 2020]. Retrieved from Internet <URL: https://www.formfactor.com/download/probe-selection-guide/>.
Waveguide Sizes [online], everything RF [retrieved on Jan. 30, 2019], Retrieved from Internet <URL:https://www.everythingrf.com/tech-resources/waveguides-sizes>.
'Piezo Motor Rod Drive', Linear Actuator Datasheet, model N-412, [online], PI corporation [retrieved on Apr. 14, 2020]. Retrieved from Internet <URL: https://static.pi-usa.us/fileadmin/user_upload/physik_instrumente/files/datasheets/N-412-Datasheet.pdf>.

* cited by examiner

*Primary Examiner* — Samuel S Outten

(57) ABSTRACT

A waveguide low profile slide-screw impedance tuner, for high tuning range (GAMMA) and seamless on-wafer integration, uses spring-loaded control of gold-plated alumina (Al2O3) tuning probe, controlling amplitude and phase of the reflection factor using miniature high precision piezoelectric actuators. This ensures the highest possible passive reflection factor GAMMA at THz frequencies. The tuner is integrated on appropriately modified commercially available THz waveguide wafer probes.

5 Claims, 15 Drawing Sheets

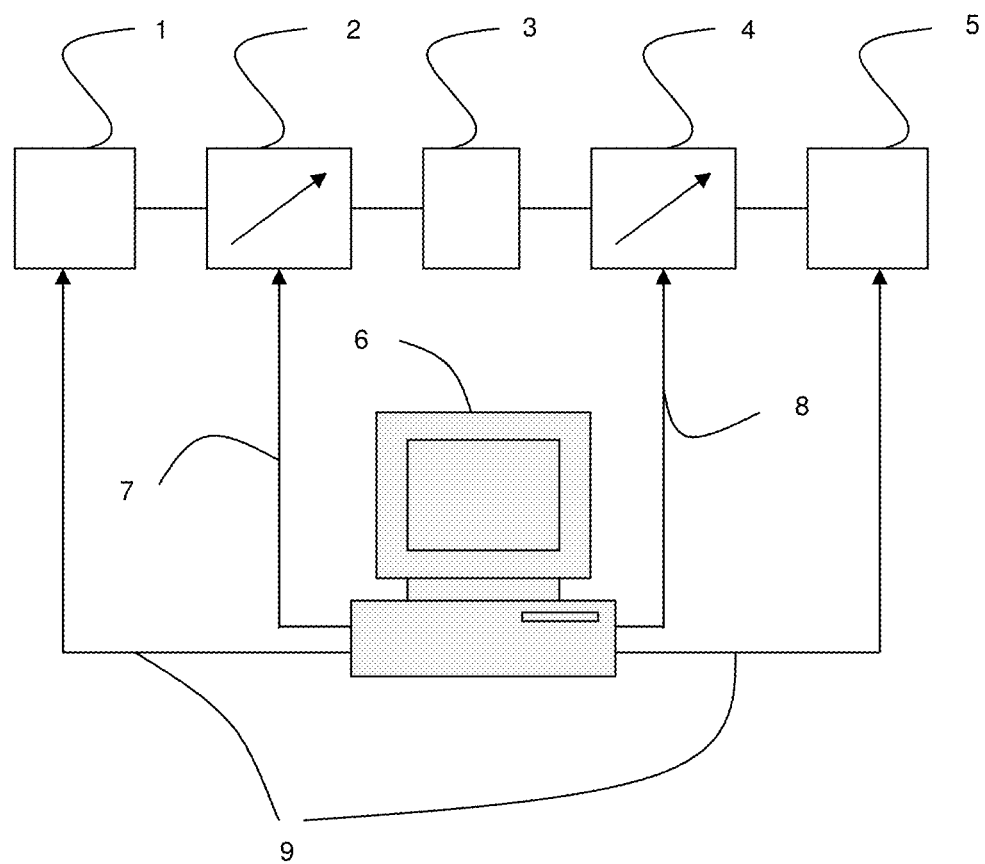
FIG. 1: Prior art

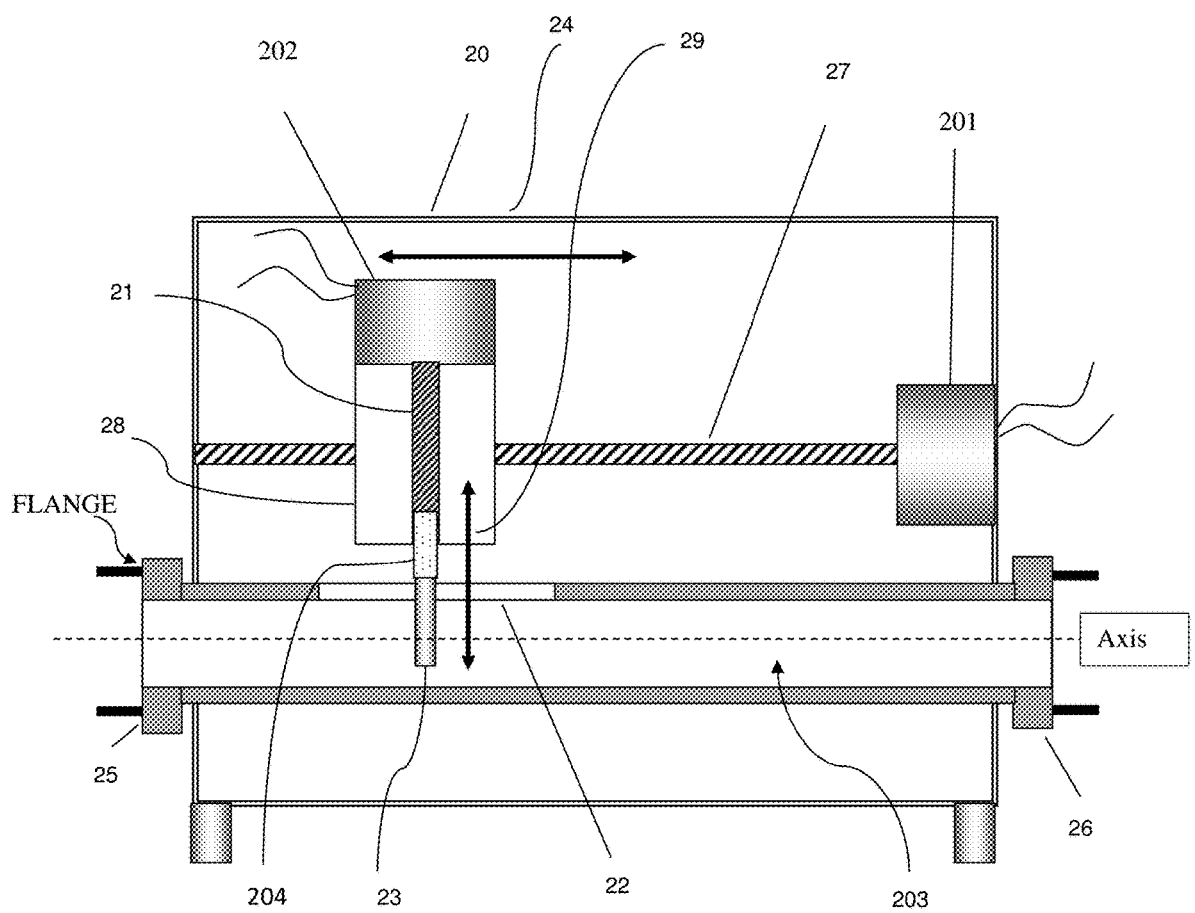
FIG. 2: Prior art

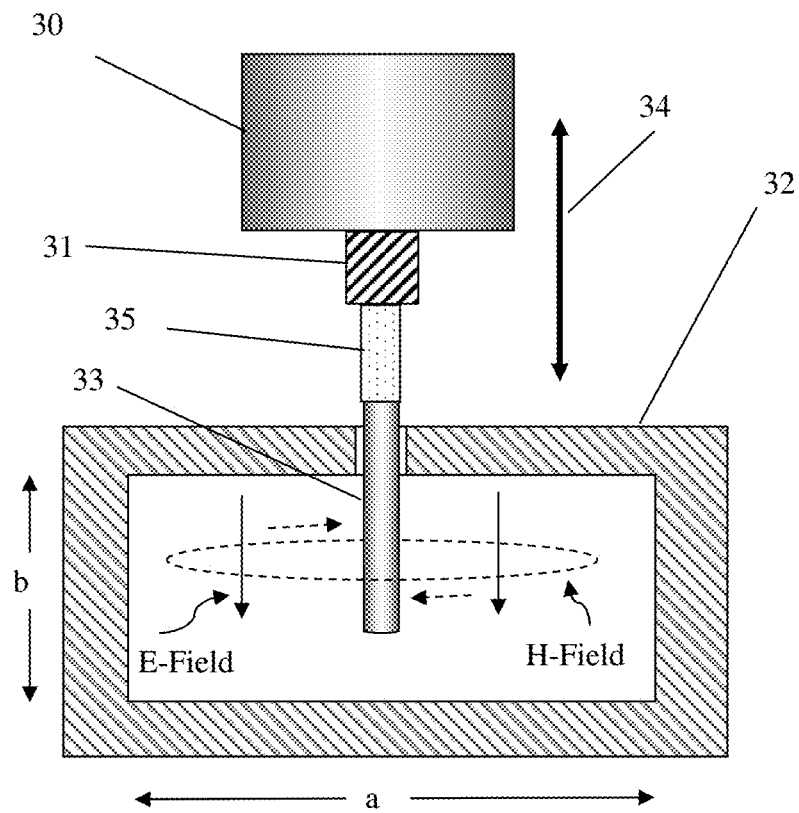
FIG. 3: Prior art

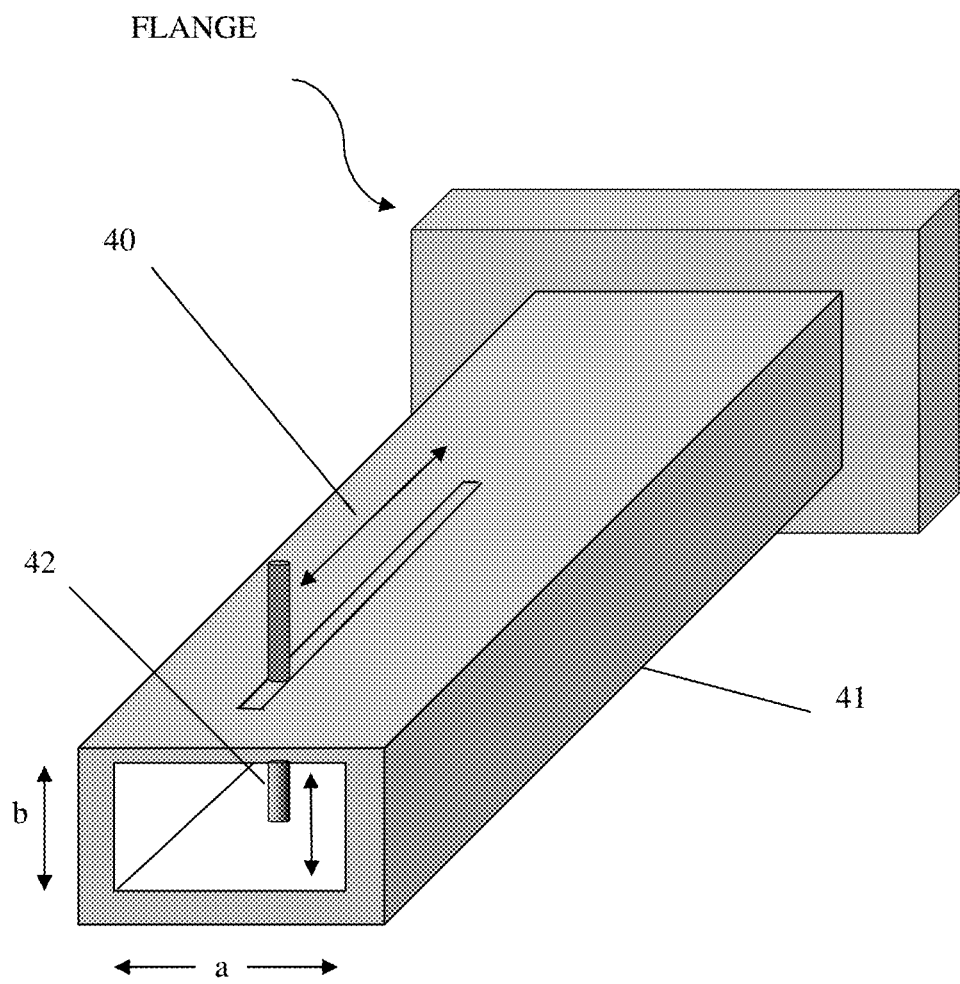
FIG. 4: Prior art

| Model | | | Frequency Range | | | Size (a – b) Inch [mm] | |
|---|---|---|---|---|---|---|---|
| WR19 | WG24 | R500 | 40.00 to 60 GHz | 31.391 GHz | 62.782 GHz | 0.188 [4.7752] | 0.094 [2.3876] |
| WR15 | WG25 | R620 | 50.00 to 75 GHz | 39.875 GHz | 79.75 GHz | 0.148 [3.7592] | 0.074 [1.8796] |
| WR12 | WG26 | R740 | 60 to 90 GHz | 48.373 GHz | 96.746 GHz | 0.122 [3.0988] | 0.061 [1.5494] |
| WR10 | WG27 | R900 | 75 to 110 GHz | 59.015 GHz | 118.03 GHz | 0.1 [2.54] | 0.05 [1.27] |
| WR8 | WG28 | R1200 | 90 to 140 GHz | 73.768 GHz | 147.536 GHz | 0.08 [2.032] | 0.04 [1.016] |
| WR6 | WG29 | R1400 | 110 to 170 GHz | 90.791 GHz | 181.583 GHz | 0.065 [1.651] | 0.0325 [0.8255] |
| WR7 | WG29 | R1400 | 110 to 170 GHz | 90.791 GHz | 181.583 GHz | 0.065 [1.651] | 0.0325 [0.8255] |
| WR5 | WG30 | R1800 | 140 to 220 GHz | 115.714 GHz | 231.429 GHz | 0.051 [1.2954] | 0.0255 [0.6477] |
| WR4 | WG31 | R2200 | 172 to 260 GHz | 137.243 GHz | 274.485 GHz | 0.043 [1.0922] | 0.0215 [0.5461] |
| WR3 | WG32 | R2600 | 220 to 330 GHz | 173.571 GHz | 347.143 GHz | 0.034 [0.8636] | 0.017 [0.4318] |

FIG. 9: Partly prior art

INTEGRATED TERA-HERTZ SLIDE SCREW TUNER

PRIORITY CLAIM

Not Applicable

CROSS-REFERENCE TO RELATED ARTICLES

1. Load Pull [online], Wikipedia [retrieved on Nov. 18, 2016], Retrieved from Internet <URL:https://en.wikipedia.org/wiki/Load_pull>.
2. "V-band programmable tuner, model 7550", Product Note 5, Focus Microwaves August 1993.
3. Standing wave ratio, VSWR [online], Wikipedia [retrieved Mar. 2, 2017], Retrieved from Internet <URL: http://en.wikipedia.org wiki/Standing_wave_ratio>.
4. "T-Wave Probes", Probe Selection Guide [online] FormFactor brochure 2018, page 15 and 17 [retrieved on Apr. 14, 2020]. Retrieved from Internet <URL: https://www.formfactor.com/download/probe-selection-guide/>
5. Simpson, G. et al. U.S. Pat. No. 5,910,754, "Reduced height waveguide tuner for impedance matching".
6. Waveguide Sizes [online], everything RF [retrieved on Jan. 30, 2019], Retrieved from Internet <URL:https://www.everythingrf.com/tech-resources/waveguides-sizes>.
7. "Piezo Motor Rod Drive', Linear Actuator Datasheet, model N-412, [online], PI corporation [retrieved on Apr. 14, 2020]. Retrieved from Internet <URL: https://static.pi-usa.us/fileadmin/user_upload/physik_instrumente/files/datasheets/N-412-Datasheet.pdf>.

BACKGROUND OF THE INVENTION

Introductory remark: Throughout this disclosure items on figures start with the number of the figure, for easier reading: Examples: item 55 is on FIG. 5; item 89 is on FIG. 8; item 112 is on FIG. 11; item 402 is on FIG. 4; item 202 is on FIG. 2 or 20 etc ....

This invention relates to Tera-Hertz (90 GHz-2 THz) load and source pull testing of transistor chips on wafer using remotely controlled electro-mechanical impedance tuners (see ref. 1). Future design of millimeter-wave amplifiers and mixers, to be used in various communication systems, especially the upcoming 6G technology, requires accurate knowledge of the active device's (millimeter-wave transistor's) characteristics, that due to unavoidable packaging parasitic elements, must be tested directly on the semiconductor wafers.

A popular method for testing and characterizing such millimeter-wave components (transistors) in the non-linear region of operation is "load pull" and "source pull". Load/source pull is a measurement technique employing impedance tuners (see ref. 2) and various other test equipment (FIG. 1). The tuners (2), (4) are used in order to manipulate the impedance conditions under which the Device Under Test (3) (DUT, or transistor) is tested, see ref. 1. The test equipment includes at least a signal source (1) which injects power into the DUT (3) and a signal detector (power meter, spectrum analyzer, etc.) measuring the resulting output power (5) and DC bias supply networks equipment and, possibly, a spectrum analyzer for signal analysis. Equipment and tuners are controlled by a computer (6) using digital cables (7, 8, 9). This document refers to "impedance tuners", in order to make a clear distinction to "tuned receivers (radios)", popularly called elsewhere also "tuners" because of the included tuning circuits.

Prior art waveguide impedance tuners (see ref. 2) comprise a solid housing (20), a waveguide transmission line (203) having an axis along the cavity, an input (or test) port (25) and an output (or idle) port (26), both ports being equipped with waveguide flanges; and a conductive adjustable tuning stub (tuning probe) insertable into a longitudinal slot (22) in the waveguide. The tuning probe has a conductive section (23) and a dielectric portion that acts as a handle (204), is mounted in a mobile carriage (28); the penetration (29) of the conductive section (23) into the slot (22) of the waveguide (203) is controlled by a precise vertical axis (21) and stepper motor (202); the dielectric handle (204) prevents energy leakage through the narrow slot (22) and creation of disturbing higher propagation modes and loss of energy. The probe is also moved (24) along the axis of the waveguide, using an ACME rod (27) or other mechanism by the stepper motor (201); the probe (23) creates a variable reactance inside the waveguide, seen also at the test port (25), allowing thus the synthesis of various impedances (or reflection factors) covering parts or most of the totality of the Smith chart (the normalized reflection factor area). The relation between reflection factor and impedance is given by GAMMA=(Z−Zo)/(Z+Zo) or VSWR=(1+|GAMMA|)/(1−|GAMMA|), see ref. 3, where Z is the complex impedance Z=R+jX and Zo is the wave impedance of the waveguide which varies, depending on the mode of electro-magnetic propagation, within a factor 2 of the free space impedance of 377 Ohms (see ref. 2).

Up to now (FIG. 3) such conductive or metallic probes (slugs) have been made in form of small cylindrical or rectangular conductive stubs (33), see ref. 5. The stubs can be attached to dielectric handles (35) in order to avoid spurious modes of propagation into the slot. The probe (33) creates a variable capacitance, increasing as it is lowered towards or withdrawn away from (34) the bottom of the waveguide (32) using the vertical axis (31) and stepper motor (30). The phase is controlled, as shown in FIG. 4, when the probe (42) is moved horizontally (40) along the waveguide (41).

Ordinary high precision vertical axes are cumbersome mechanics (FIG. 8) and present an important high profile (H) which creates a mechanical conflict with the microscope (FIG. 7); to avoid this conflict one had to use waveguide S-shaped sections which, already at frequencies below 100 GHz create unacceptable insertion loss and reduction of tuning range (GAMMA. MAX). FIG. 9 shows unmistakably the implications and indicates the proposed introduction of the new apparatus in the position marked [New Tuner].

As the frequency range of operation increases, the dimensions a (width) and b (height) (FIG. 3, 4) of the waveguide decrease, as shown in the table of FIG. 5. For frequencies up to 120 GHz, metallic rod probes, attached to dielectric handles (FIG. 3) were adequate, but with increasing frequency (type WR8) their diameter becomes too small (<0.6 mm) to handle reliably; as a rule of thumb the slot in the waveguide shall not exceed ⅓ of the width (a/3) and the probe shall not make galvanic contact with the slot wall; for a waveguide WR-10 (FIG. 5) a=2.54 mm or the diameter of the probe rod shall be smaller than 0.8 mm (0.03"), which is still handlebar. For a WR-3 waveguide, though, the diameter would become 0.25 mm (0.01"), which is critical. Therefore, a different method is required.

SUMMARY OF THE INVENTION

This invention describes Tera-Hertz (>150 GHz) frequency, computer controlled electro-mechanical impedance tuners and an integration method for low-loss high-Gamma operation in a wafer test setup. The basic requirements are twofold: a) the tuner must have very low profile to be insertable in the conflict area (FIG. 7) and b) the tuner must be integrated as close to the wafer probe as mechanically possible to minimize insertion loss as indicated in FIG. 9. The low-profile shape of the new tuner is made possible by using a different vertical axis mechanism as up to now and the horizontal movement uses a new method as well. In both cases extreme high resolution and precision piezo-electric actuators are used (FIGS. 10-12 and 14-15 and ref. 7), which are remote controlled via appropriate electronic interface and software from a main control computer.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated transistor load-pull test system.

FIG. 2 depicts prior art, a front view of an automated slide screw waveguide impedance tuner using a single vertical axis and capacitive stub probe.

FIG. 3 depicts prior art, cross section of capacitive stub probe inside a slotted waveguide transmission line.

FIG. 4 depicts prior art, a perspective view of the movement of a stub tuning probe in the waveguide slot.

FIG. 5 depicts prior art, a table showing model nominations, dimensions and frequency range to popular waveguides (ref. 6).

DETAILED DESCRIPTION OF THE INVENTION

Figure 6:
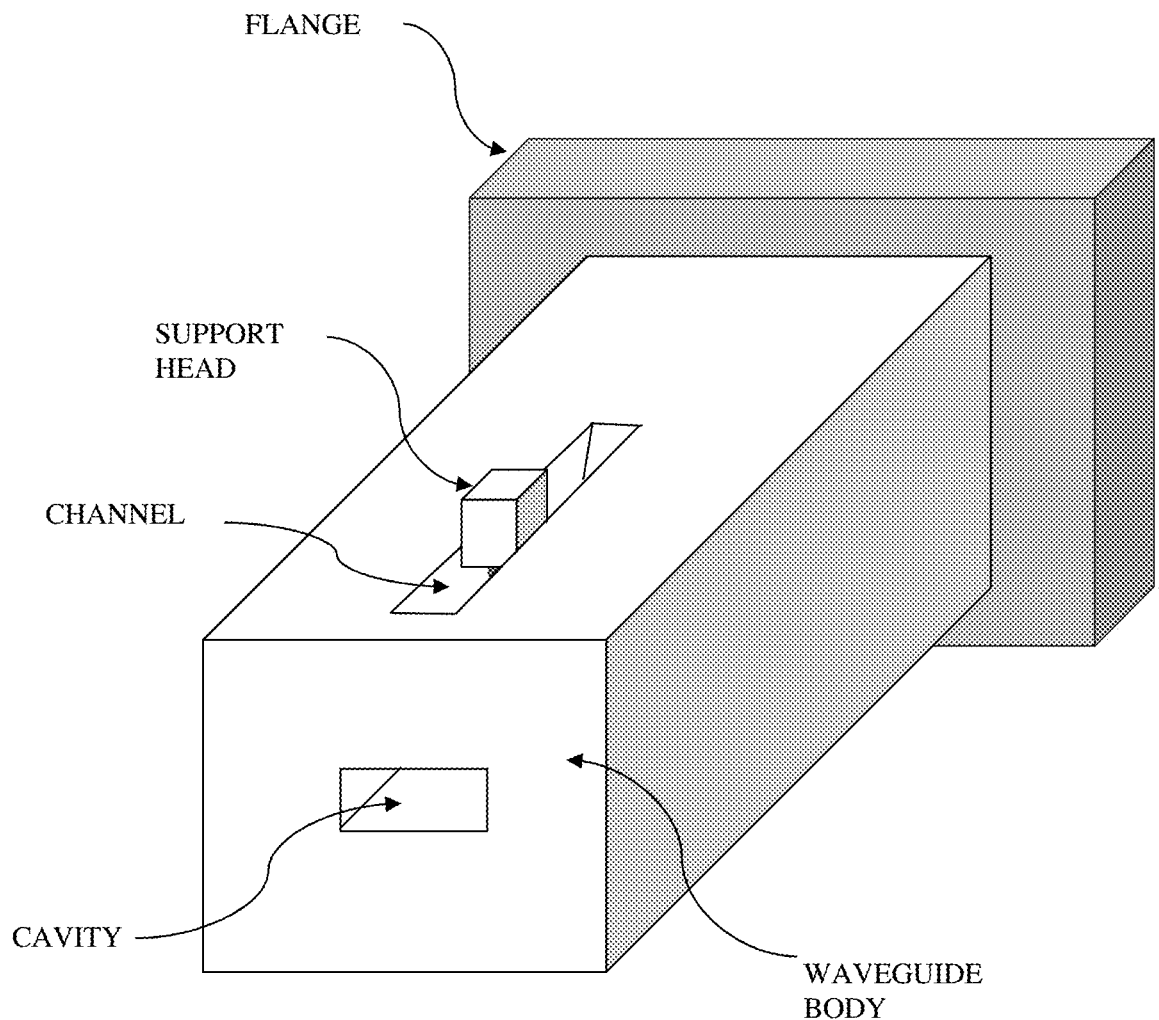
FIG. 6 depicts a perspective view of the concept of the integrated tuning probe of which the support head penetrates into the guiding channel of the waveguide.
Figure 7:
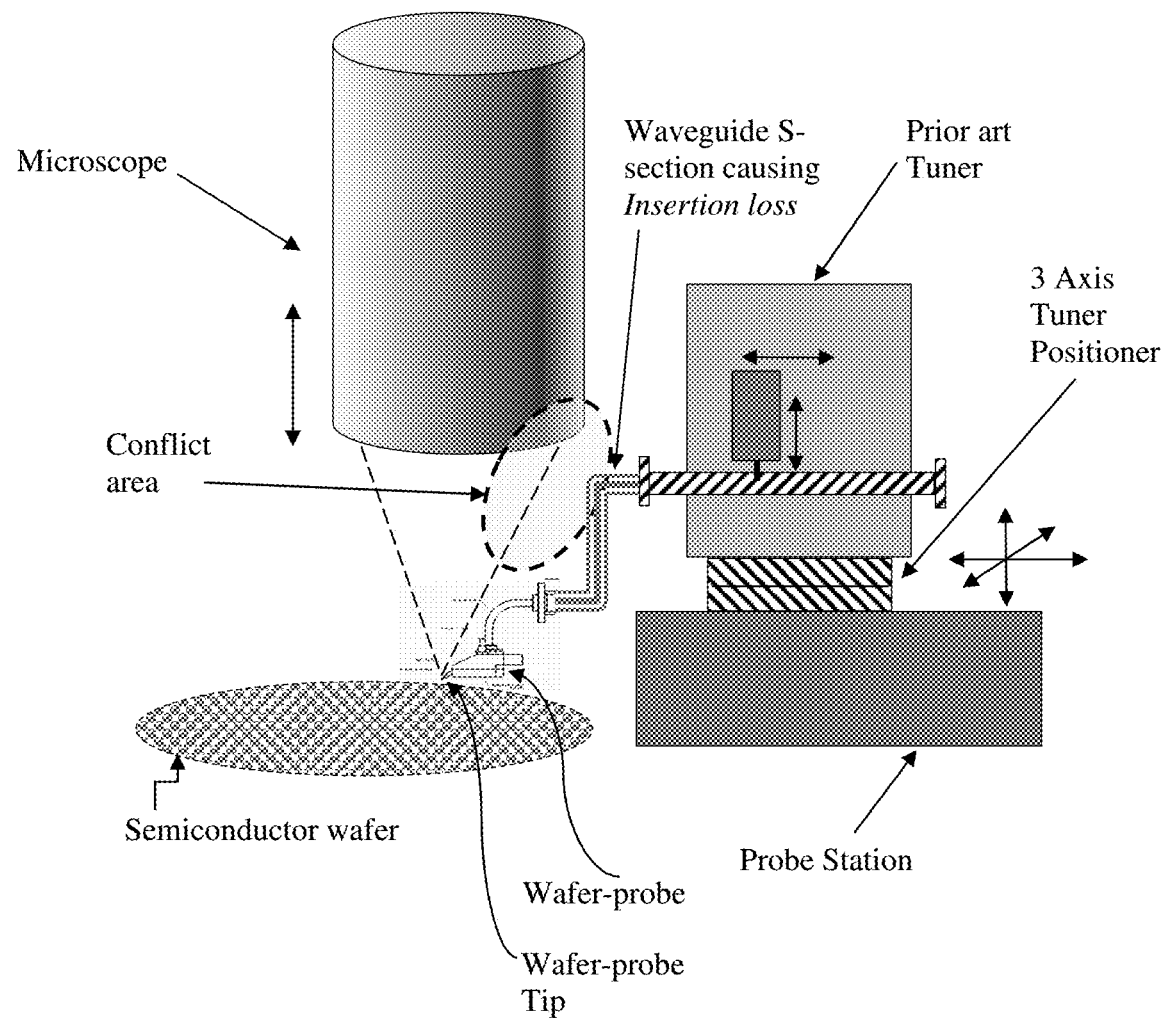
FIG. 7 depicts prior art, hitherto typical integration of waveguide slide screw tuners on a wafer probe station, comprising lengthy waveguide S-shaped sections to avoid conflict with the microscope (see also FIG. 9).
Figure 8:
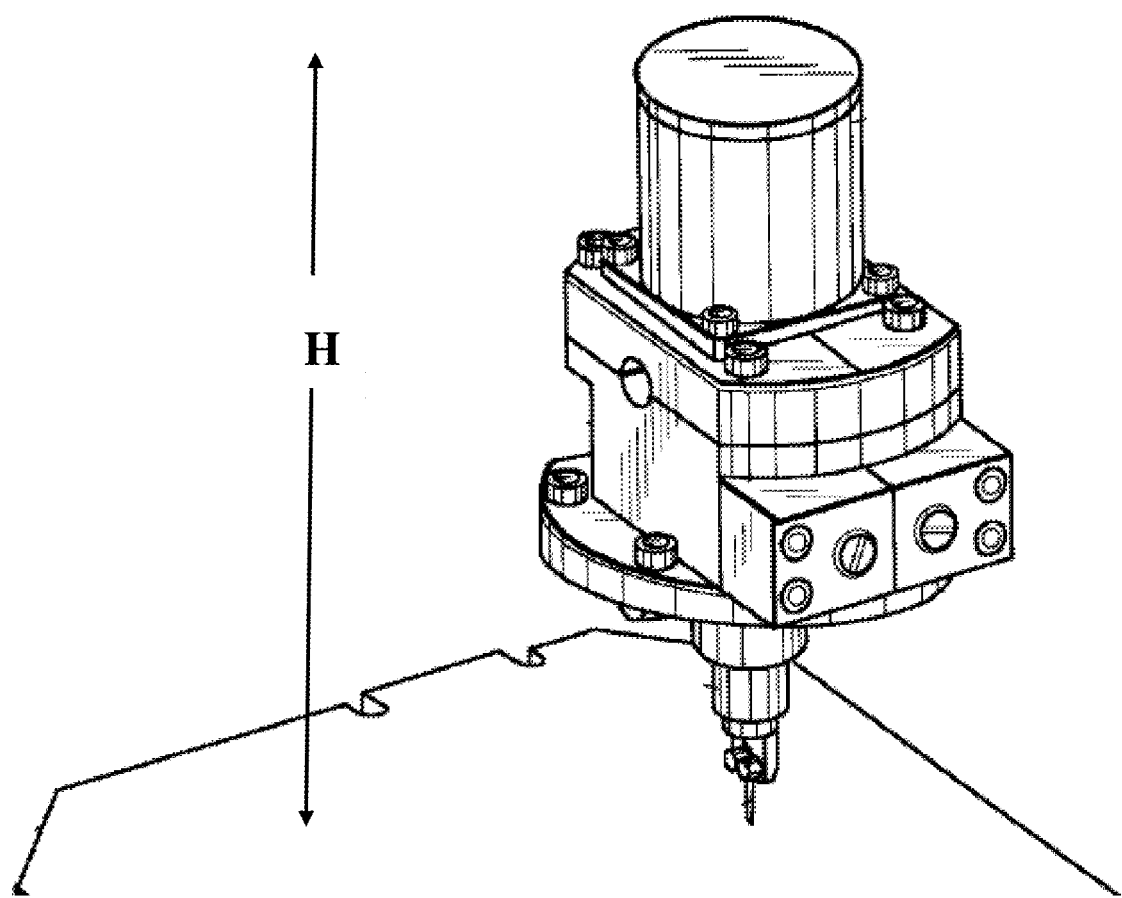
FIG. 8 depicts prior art, the complexity of existing (ref. 6, FIG. 8), typical vertical axis for waveguide tuner, which is incompatible with efficient on wafer integration; (numbered items in FIG. 8 are not referred to in the specification).
Figure 13:
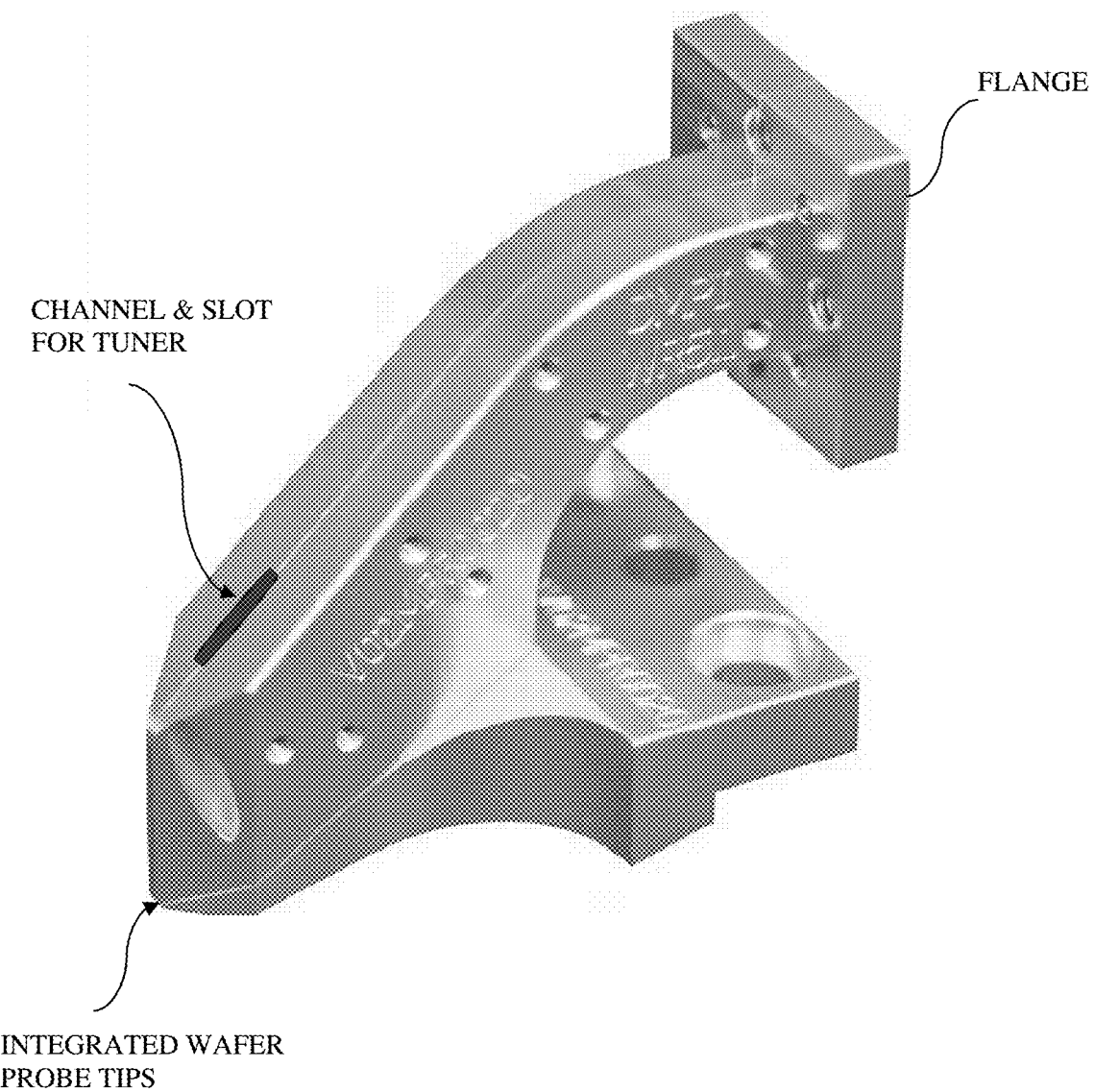
FIG. 13 depicts commercially available Terahertz wafer probe (see ref. 4, S-model) on which the new tuner is (typically) integrated.

The slide screw tuner is integrated on the waveguide wafer probe. The term "slide screw" has been used in laboratory jargon for many years: It signifies the concept of a slotted airline (coaxial or waveguide) in which penetrates a reflective (metallic, or metallized) stub (tuning probe), which is moved parallel and/or perpendicular to the slotted airline using, typically, lead screws. The waveguide wafer probe used in this invention, includes a waveguide body having the probe tips on one end and a waveguide flange on the other (FIG. 13). A cavity traverses the body lengthwise from the probe tips (shown in ref. 4, figures on page 15) to the flange; the cavity is dimensioned according to the table on FIG. 5 for any specific frequency range; the flange allows connecting to auxiliary instrumentation for testing purposes. The concept of the integrated waveguide tuner is different than prior art in three major areas: (1) it uses a two-section tuning probe comprising a guiding support body and head (FIGS. 6 and 11) and a thin, gold plated, tuning element (protrusion, stub, plunger) etched out of the ceramic substrate of the head; (2) it employs a new, ultra low profile, concept of vertical probe control; and (3) it uses remotely controlled linear piezo-electric actuators, instead of hitherto used stepper motors, placed flat on the waveguide body for both, horizontal and vertical tuning probe control. Whereas horizontal control can be considered a somehow obvious enhancement of existing stepper motor-based pulley-belt-ACME leadscrew or rack-and-pinion control (FIG. 2), the vertical horizontal-to-vertical translation mechanism is an entirely new concept in tuner technology. This new concept works only for small displacements and is suitable for frequencies requiring only small tuning probe travels. THz tuners are such devices. The vertical size "b" of the cavities, and thus the required travel, is less than 0.8 mm for frequencies above 110 GHz (FIG. 5), which is compatible with the new design.

Whereas the horizontal control of the selected piezo-electric actuators (1202 and 1203 in FIG. 12, see ref. 7) provides for travel control of at least 10 mm, which allows lowest frequencies of 15 GHz both in waveguide and coaxial tuners (minimum travel is one half on a wavelength); in THz waveguide tuners the vertical direction design is different. Here the horizontal travel (129) of the axis of the actuator 2 (1202 in FIG. 12) is converted into a much smaller vertical travel (1201) by a ratio of at least 10/0.8=12.5 for 110 GHz tuners and 10/0.4=25 for 220 GHz tuners and higher for higher frequencies (FIG. 5).

Figure 12:
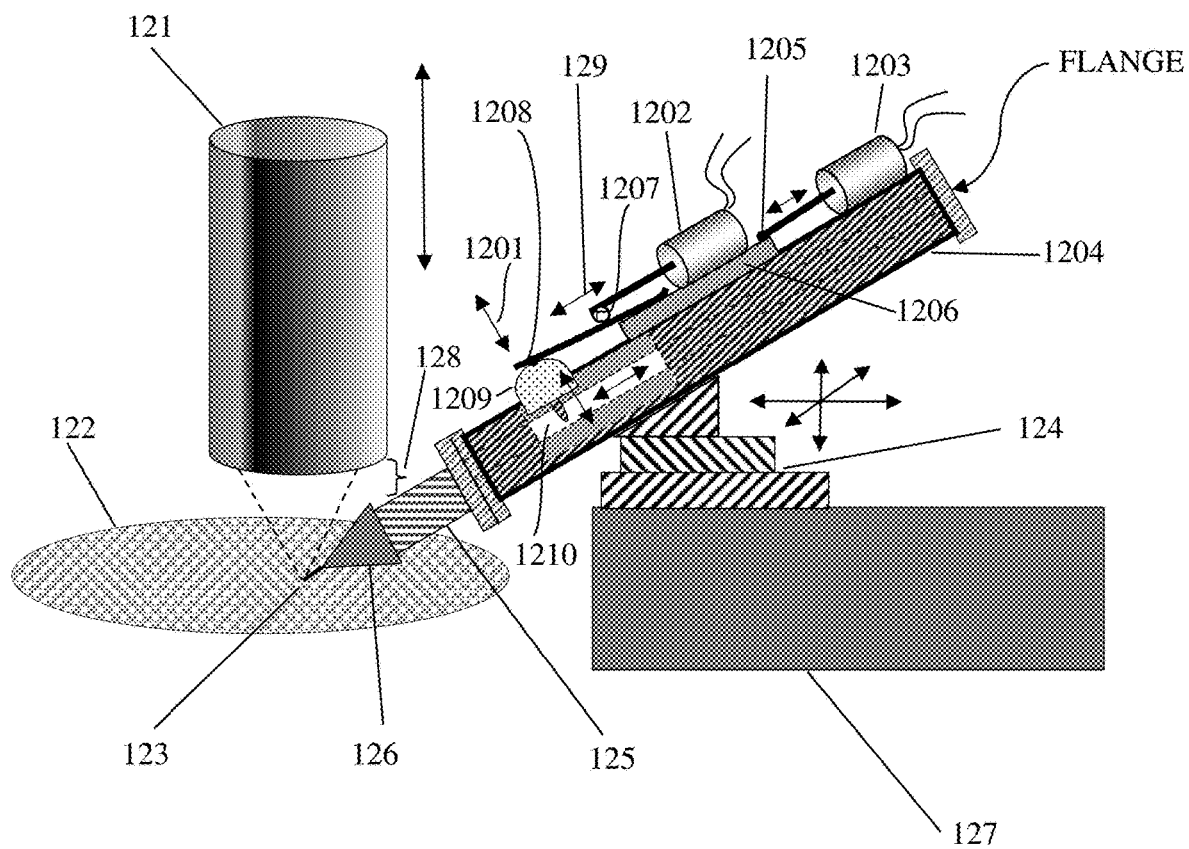
FIG. 12 depicts integration of ultra low-profile waveguide tuner on a wafer probe station.

In more detail the integration is as shown in FIG. 12: actuator 1 (1203) is permanently anchored on the waveguide body (1204); its axis is attached to one end (1205) of the mobile platform (1206) and can push or pull it linearly towards the slot (1210) reaching into the cavity of the waveguide. The platform (1206) slides on top of the waveguide body parallel to the waveguide cavity. The tuner body itself (1204) is mounted on a three axis tuner positioner (124) which is mounted on the wafer prober platform (127); in prior art only the wafer probe was mounted and controlled by the 3 axis probe positioner (FIG. 9) independently of the tuner; the tuner itself was mounted fixed remotely at the cost of higher insertion loss and reduced tuning (GAMMA) range; the actuator 2 (1202) is anchored permanently on the mobile platform 1206) and its axis is equipped at its end with a rolling capability (1207); the roller rolls on the pre-loaded steel blade (1208) which it attached, at its far end, on the tuning probe support head (1209); this way a linear horizontal (parallel to the waveguide body) movement of the axis of actuator 2 is translated into a reduced, by a factor between 10 and 20, vertical (perpendicular to the waveguide body) movement, thus controlling the amplitude of the reflection factor |GAMMA|. The upwards pre-loading of the steel blade (1208) ensures that, when the axis of actuator 2 withdraws, the tuning probe also withdraws from the cavity (1210). Since the blade (1208) is permanently attached to the mobile platform (1206) it also pulls the tuning probe, thus controlling the phase F of the reflection factor (GAMMA=|GAMMA|*exp(jΦ)).

Figure 9:
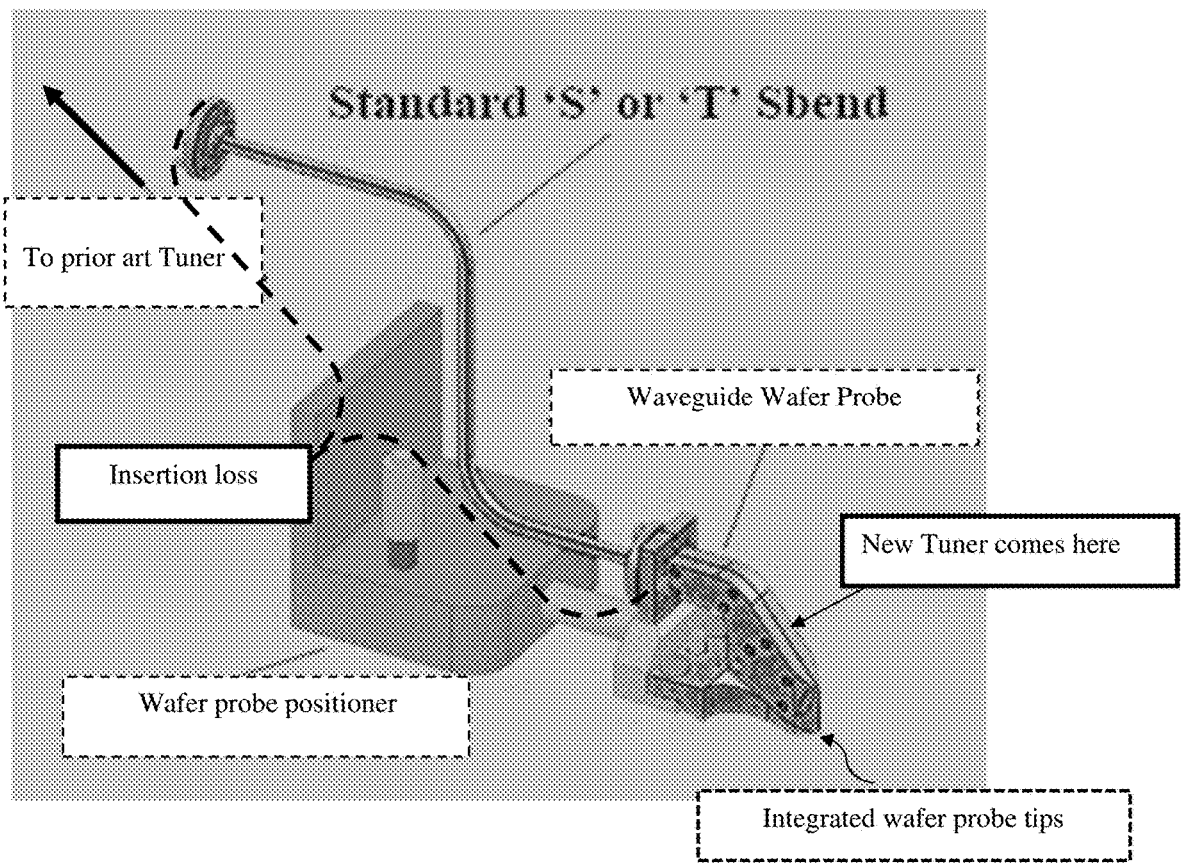
FIG. 9 depicts partly prior art, commercially available waveguide S-bend for millimeter-wave wafer probes controlled by wafer probe-positioner, instead of tuner-positioner, and the location of the new integrated tuner on the wafer probe.
Figure 10:
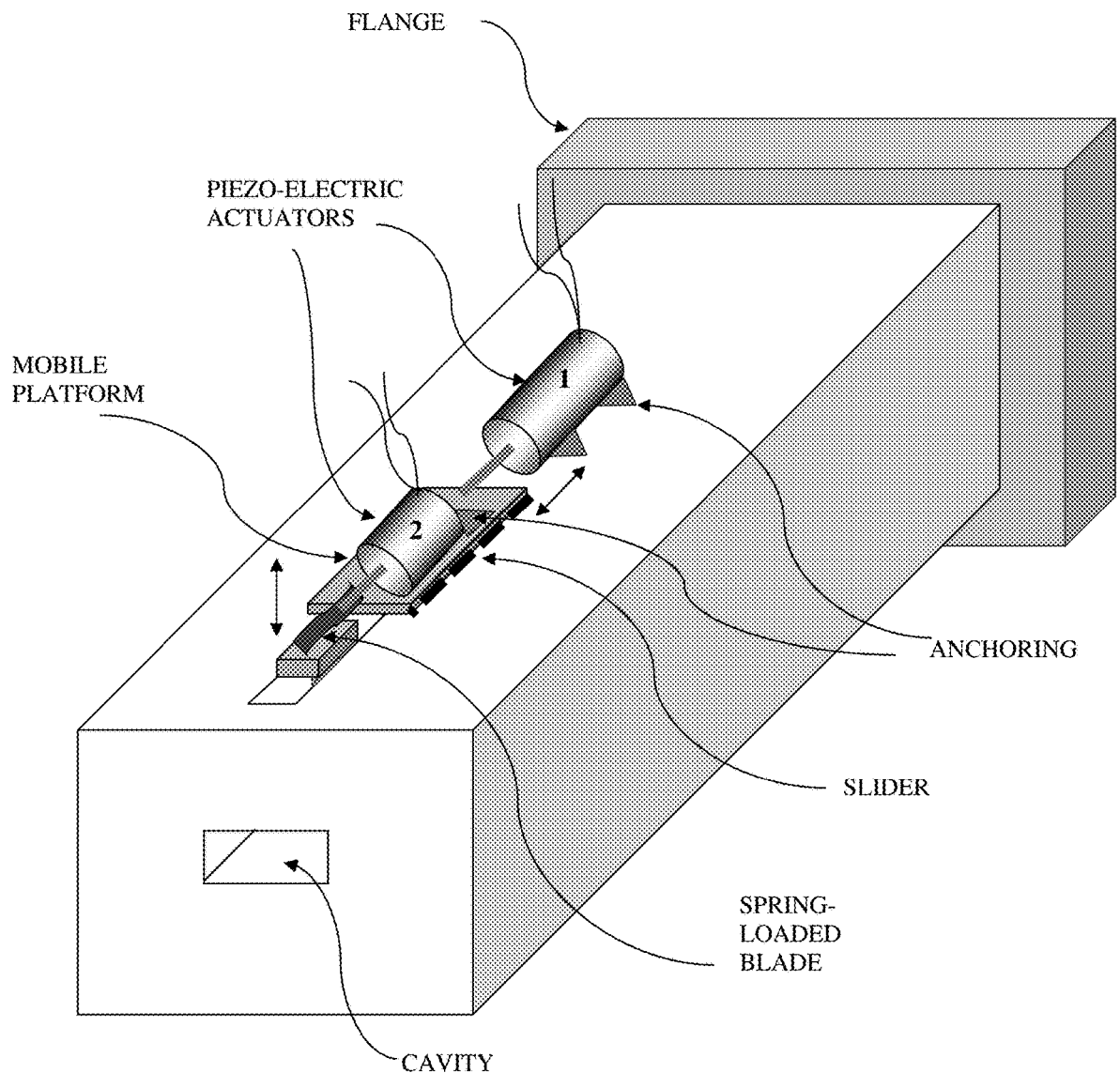
FIG. 10 depicts integrated waveguide tuner with horizontal and vertical tuning probe control using a pair of high precision, high resolution piezo-electric actuators (see ref. 7).
Figure 14:
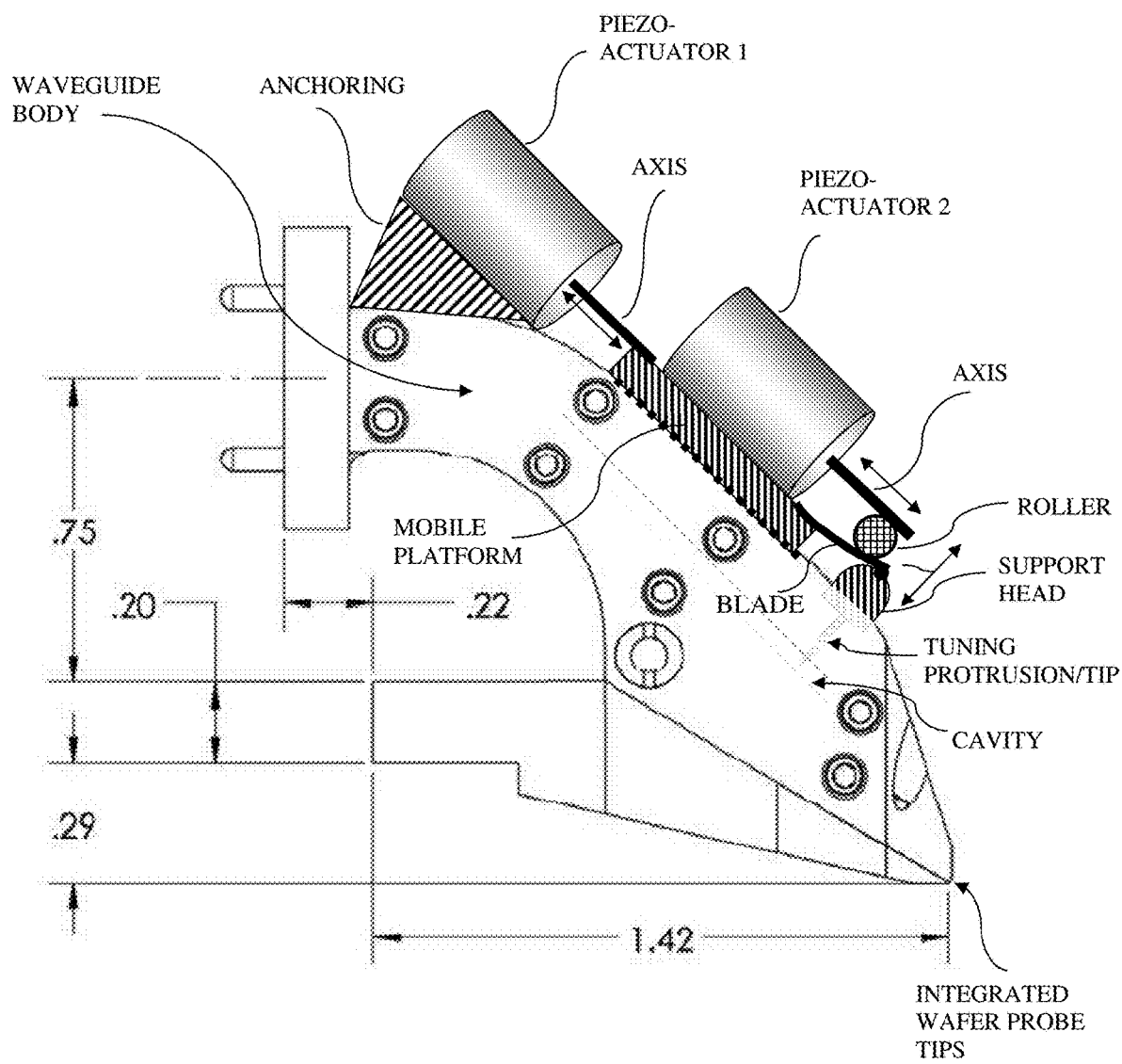
FIG. 14 depicts integration of waveguide tuner on waveguide probe of FIG. 13.
Figure 15:
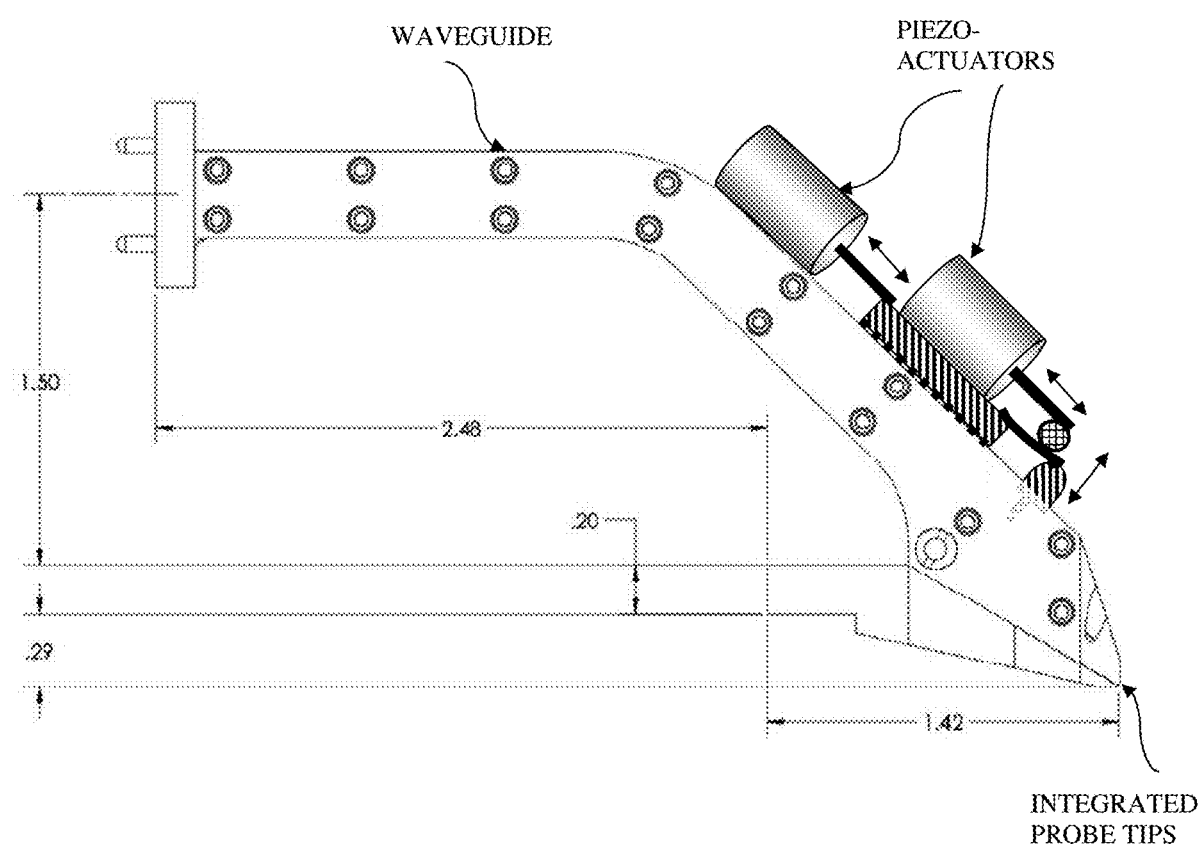
FIG. 15 depicts integration of waveguide tuner on alternative model waveguide probe (see ref. 4, T-model).

The tuner body (1204) can include wafer probe (126) directly (FIG. 14), which is best, or can be connected with the wafer-probe (126) using a short straight piece of waveguide (125); include also means that the tuner is part of the wafer probe itself, as shown in FIGS. 14 and 15; the configuration of FIG. 12 allows for free space (128) between the tuner and the microscope (121), thus making a straight forward integration of the waveguide tuner on the wafer (122) possible and offers improved efficient access to the on-wafer DUT (123) compared with the prior art configuration of FIG. 9.

Figure 11:
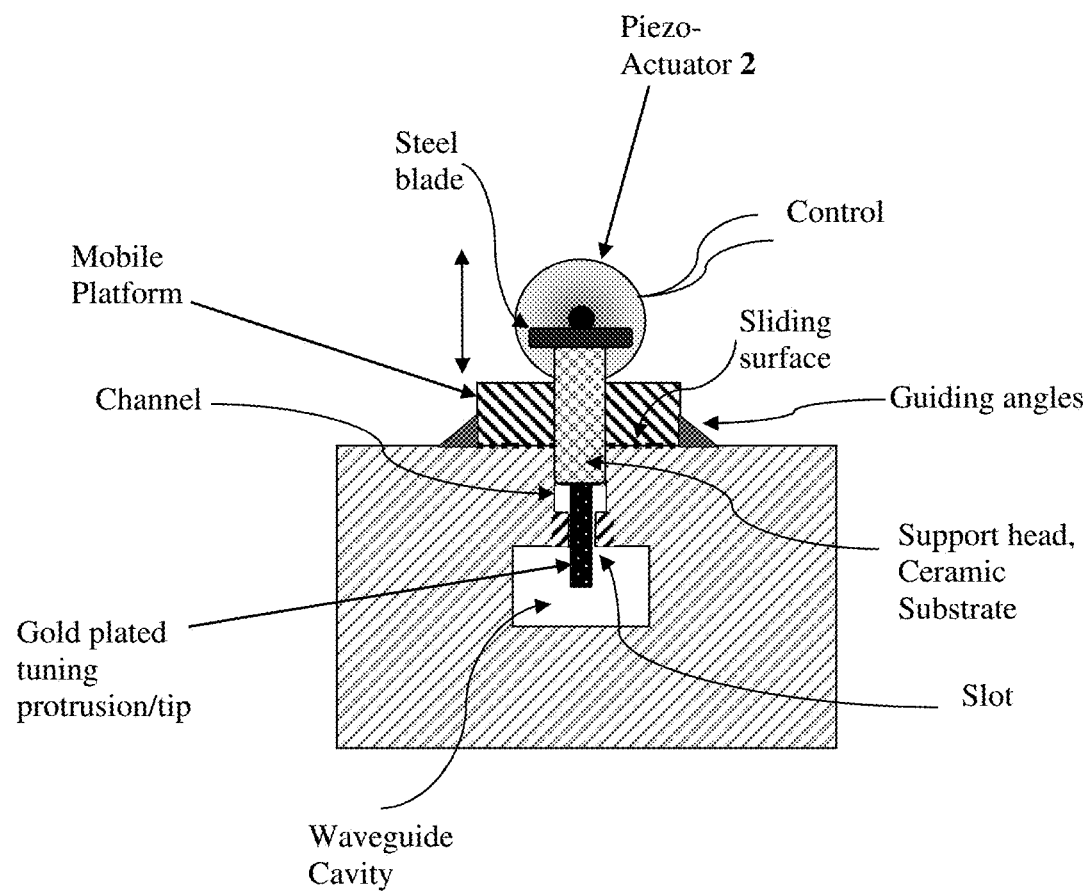
FIG. 11 depicts cross section of low-profile tuning probe control which replaces the prior art vertical axis.

The new tuning probe control requires attention, both in horizontal (parallel to the waveguide body) and vertical (perpendicular to the waveguide body). In horizontal both the movement resolution (individual step-size) and straightness are important. The actuators offer a submicron minimum step-size, sufficient for frequencies up to 1 THz ($\lambda \approx 300$ µm). The sliding mobile platform (FIG. 11) must also be well guided, along the cavity and symmetry axis of the waveguide. This is possible using some adjustable guiding angles (FIG. 11). The attachment of the axis of actuator 1 (1203) on the platform (1205) must allow for some flexibility to tolerate any residual misalignment between the platform guide and the actuator axis movement.

The vertical control is as much or even more critical: the axis of actuator 2 (1202) must roll (1207) or slide with negligible friction on the preloaded steel blade (1208). The blade allows the probe head (1209) to be guided by the channel (FIG. 11), which is precisely machined into the body of the waveguide, roughly one third- to half-way between the top of the body and the cavity. It is the precision and parallelism of this channel that decides about the accurate horizontal and vertical positioning of the gold-plated tuning tip (protrusion) of the tuning probe, because the dimensions and tolerances are very tight. The gold-plated tuning tip must penetrate, withdraw and travel along the slot quasi frictionless and contactless relative to the slot walls (FIG. 11) with micrometric accuracy. Piezo-electric actuators are, so far, the best solution for such task. The typical reduction ratio of 10:1 or 20:1 between submicron linear movement resolution of the axis of actuator 2 and vertical movement of the tuning probe ensures very high (submicron-to-nano-metric) vertical movement resolution and thus adequate reflection factor control, even for the smallest vertical cavity dimensions "b" of 200-400 µm (FIG. 5).

Commercially available THz wafer probes are shown in FIGS. 13 and 15. In FIGS. 14 and 15 also the schematic tuner integration concept is shown in self-explanatory manner. In FIG. 13 the short neck probe is shown with indication of where the guiding channel and slot will be machined. Details of this integration are shown in FIG. 14: The entire mechanism is carried on the waveguide body including both piezo-actuators, the mobile platform and the steel blade controlling the probe support head. This is the most efficient passive waveguide tuner integration to date. Alignment and guidance of the parts is, obviously, due to the microscopic dimensions involved, of outmost importance. A replica of this basic concept is shown for the long neck wafer probe in FIG. 15. Again, since, for load pull tuning purposes, only the insertion loss between the probe tip and the tuning stub (protrusion) matter, both integrations are, from RF point of view, equivalent and only integration restrictions regarding the diameter and focus distance of the microscope shall decide which to choose (FIG. 12).

Obvious alternative embodiments concerning the appropriate form of the make and integration of a waveguide slide screw tuner structure are possible but shall not impede on to the basic idea and the broad validity of the present invention.

What is claimed is:

1. A waveguide slide screw impedance tuner, comprising
a modified, waveguide-based, wafer probe having a waveguide body, a flange and integrated wafer probe tips,
wherein
the waveguide body comprises a lengthwise cavity, which reaches from the wafer probe tips to the flange and has a width and a height;
two remotely controlled piezo-electric actuators 1 and 2, each having body and axis,
one mobile platform with a slider,
a pre-loaded steel blade, and
a tuning probe, comprising
a support head and a gold-plated tuning protrusion (tip),
wherein
a guiding channel and a slot are machined into the waveguide body along the center of the cavity,
and wherein
the guiding channel extends from the outside surface of the waveguide body until approximately one third- to half-way towards the cavity,
and has a width allowing the support head of the tuning probe to slide-fit in,
and wherein the said slot
extends from the center of the bottom of the guiding channel to the cavity and has a width not larger than ⅓ of the width of the cavity,
and wherein the guiding channel and the slot
are close to the wafer probe tips, and
have a length of at least one half of the wavelength at the lowest frequency of operation,
and wherein
both piezo-electric actuators are mounted parallel to the cavity,
the body of piezo-electric actuator 1 is anchored on the waveguide body and its axis is attached to the mobile platform, which slides on top of the waveguide body parallel to the cavity;
the body of piezo-electric actuator 2 is anchored on the mobile platform and the end of its axis is rolling on the pre-loaded steel blade pushing it perpendicular to the waveguide body;
the spring-loaded steel blade is attached on one end to the mobile platform and on the other end to the support head of the tuning probe;
the gold-plated tuning protrusion (tip) of the tuning probe contactlessly traverses the slot and penetrates into, or withdraws from, the cavity.

2. The tuning probe of the waveguide tuner of claim 1, wherein
the support head of the tuning probe slide-fits into the guiding channel and guides the gold-plated tuning protrusion (tip) along and in and out from the slot of the waveguide.

3. The gold-plated tuning protrusion (tip) of the tuning probe as in claim 2, has a thickness less than ⅓ of the width of the cavity of the waveguide.

4. The axis of piezo-electric actuator 2 of claim 1 comprising,
   on the end associated with the tuning-probe, a roller exercising smooth and continuous force on the tuning probe, held by the pre-loaded steel blade, forcing it to penetrate in a controllable manner into the cavity of the waveguide.

5. The piezo-electric actuators of the tuner of claim 1 being remotely controlled by control software using an appropriate electronic interface.

* * * * *